United States Patent
Ker et al.

(10) Patent No.: US 6,882,009 B2
(45) Date of Patent: Apr. 19, 2005

(54) ELECTROSTATIC DISCHARGE PROTECTION DEVICE AND METHOD OF MANUFACTURING THE SAME

(75) Inventors: Ming-Dou Ker, Hsinchu (TW); Tang-Kui Tseng, Hsinchu (TW); Hsin-Chin Jiang, Hsinchu (TW); Chyh-Yih Chang, Hsinchu (TW); Jeng-Jie Peng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/230,055

(22) Filed: Aug. 29, 2002

(65) Prior Publication Data

US 2004/0043568 A1 Mar. 4, 2004

(51) Int. Cl.⁷ .......................... H01L 21/01; H01L 23/62
(52) U.S. Cl. .................... 257/349; 257/356; 257/408
(58) Field of Search ................................ 257/315, 349, 257/356, 362, 408, 345; 438/279, 390, 301, 303, 305

(56) References Cited

U.S. PATENT DOCUMENTS

| | | | | |
|---|---|---|---|---|
| 5,698,884 A | * | 12/1997 | Dennen | 257/345 |
| 6,147,383 A | * | 11/2000 | Kuroda | 257/344 |
| 6,239,472 B1 | * | 5/2001 | Shenoy | 257/408 |
| 6,256,184 B1 | | 7/2001 | Gauthier Jr. et al. | |
| 6,465,311 B1 | * | 10/2002 | Shenoy | 438/300 |
| 6,528,850 B1 | * | 3/2003 | Hebert | 257/345 |

* cited by examiner

*Primary Examiner*—David S. Blum
(74) *Attorney, Agent, or Firm*—Finnegan, Henderson, Farabow, Garrett & Dunner, L.L.P.

(57) ABSTRACT

An electrostatic discharge protection device that includes a semiconductor substrate of a first dopant type, at least one source/drain pair of a second dopant type formed in the substrate, wherein the source/drain pair is separated to define a channel region therebetween, a lightly-doped region of the first dopant type defined between the source/drain pair and including at least a portion of the channel region, a gate dielectric layer formed over the substrate, and a gate formed over the gate dielectric layer and above the channel region.

13 Claims, 20 Drawing Sheets

ELECTROSTATIC DISCHARGE PROTECTION DEVICE AND METHOD OF MANUFACTURING THE SAME

RELATED APPLICATION

This application is related to U.S. patent application entitled "ELECTROSTATIC DISCHARGE PROTECTION CIRCUIT WITH ACTIVE DEVICE," filed on Aug. 29, 2002, Ser. No. 10/230,287. This related application is expressly incorporated herein by reference.

DESCRIPTION OF THE INVENTION

1. Field of the Invention

This invention pertains in general to a semiconductor device, and, more particularly, to an electrostatic discharge protection device and method for manufacturing the same.

2. Background

A semiconductor integrated circuit ("IC") is generally susceptible to an electrostatic discharge ("ESD") event, which may damage or destroy the IC. An ESD event refers to a phenomenon of electrical discharge of a current (positive or negative) for a short duration during which a large amount of current is provided to the IC. The high current may be built-up from a variety of sources, such as the human body.

Advanced MOSFET transistors, such as those manufactured using sub-quarter-micron processes, have traditionally required certain processes such as silicide processes, lightly-doped drain (LDD) structures, and thin gate dielectric layers. As a result, the advanced MOSFET transistors are particularly susceptible to an ESD event.

Conventional ESD protection devices are implemented using bipolar junction transistors ("BJTs"), gate grounded NMOS ("GGNMOS") transistors, silicon controlled rectifiers ("SCR"), and silicon junction diodes, to name a few examples. Conventional NMOS devices have a threshold voltage of about 0.6V adjustable by changing the concentration of the p-type implant in the channel regions. These devices disadvantageously have slow turn-on speed and therefore poor ESD robustness.

An example of a conventional ESD protection device in input/output (I/O) pad design is shown in FIGS. 1 and 2, reproduction of FIGS. 1B and 2, respectively, of U.S. Pat. No. 6,256,184 to Gauthier, entitled "Method and Apparatus for Providing Electrostatic Discharge Protection." Gauthier describes an ESD protection structure that includes low threshold and zero threshold FETs to conduct transient ESD currents during an ESD event. Referring to FIG. 1, an NMOS 115 for ESD protection device has a low threshold voltage, and, during normal operation, is required to connect to a negative voltage source 201 at the gate to turn off channel current. Referring to FIG. 2, an ESD protection circuit 101 comprises a source diode 203 to minimize leakage current during normal IC operation.

A conventional NMOS device is generally formed in a p-well, and is manufactured by first providing a substrate and forming shallow trench isolations ("STIs") or local oxidation silicon ("LOCOS"). The steps of p-well implantation, anti-punchthrough implantation, and channel implantation then follow. In general, the p-well has the largest implant depth and the lowest doped concentration, and the channel region has the smallest implant depth and the highest doped concentration. The steps of n-well implantation, anti-punchthrough implantation, and channel implantation follow then. A gate oxide layer is then formed over the substrate, and a gate is formed over the gate oxide layer. Sidewall spacers are formed contiguous with the gate. Finally, source and drain regions are formed to finish the fabrication of the NMOS in a p-well.

SUMMARY OF THE INVENTION

In accordance with the invention, there is provided an electrostatic discharge protection device that includes a semiconductor substrate of a first dopant type, at least one source/drain pair of a second dopant type formed in the substrate, wherein the source/drain pair is separated to define a channel region therebetween, a lightly-doped region of the first dopant type defined between the source/drain pair and including at least a portion of the channel region, a gate dielectric layer formed over the substrate, and a gate formed over the gate dielectric layer and above the channel region.

In one aspect, the device includes a pocket region of the first dopant type formed adjacent one of the source/drain pair and under the gate.

In another aspect, the device includes an anti-punchthrough region of the first dopant type formed under the channel region and extending between the source/drain pair.

Also in accordance with the present invention, there is provided an electrostatic discharge protection device that includes a semiconductor substrate of a first dopant type, a well region of the first dopant type formed in the substrate, a source region of a second dopant type formed in the well region, a drain region pair of a second dopant type formed in the well region and spaced apart from the source region, a channel region formed between the source and drain regions, a lightly doped region of the first dopant type defined between the source and drain regions, and a gate formed on the substrate and over the channel region.

Further in accordance with the present invention, there is provided an electrostatic discharge protection device that includes a semiconductor substrate of a first dopant type, at least one source/drain pair of a second dopant type formed in the substrate, wherein the source/drain pair is separated to define a channel region therebetween, a lightly doped region of the second dopant type defined between the source/drain pair and including at least a portion of the channel region, a gate dielectric layer formed over the substrate, and a gate formed over the gate dielectric layer and above the channel region.

In accordance with the present invention, there is provided a method of manufacturing an electrostatic discharge protection device that includes providing a semiconductor substrate of a first dopant type having a surface, masking an area of the surface of the semiconductor substrate, implanting the semiconductor substrate with a dopant of a second dopant type, implanting the semiconductor substrate with a dopant of the first dopant type, unmasking the area of the surface of the semiconductor substrate, forming at least one source/drain pair of a second dopant type in the area, wherein the source/drain pair is separated to define a channel region therebetween, and forming a gate on the substrate and over the channel region.

In one aspect, in masking an area of the surface, the method includes applying a dummy layer over the area of the surface.

In another aspect, prior to masking an area of the surface, the method includes forming a deep well region of the second dopant type in the substrate.

Also in accordance with the present invention, there is provided a method of manufacturing an electrostatic discharge protection device that includes providing a semiconductor substrate of a first dopant type having a surface, forming a well region of the first dopant type in the semiconductor substrate, masking an area of the surface disposed on the well region of the first dopant type, implanting the semiconductor substrate with a dopant of a second dopant type, implanting the semiconductor substrate with a dopant of the first dopant type, unmasking the area of the surface disposed on the well region of the first dopant type, forming at least one source/drain pair of a second dopant type in the area, wherein the source/drain pair is separated to define a channel region therebetween; and forming a gate on the substrate and over the channel region.

Further in accordance with the present invention, there is provided a method of manufacturing an electrostatic discharge protection device that includes providing a semiconductor substrate of a first dopant type having a surface, masking a first area of the surface of the semiconductor substrate, implanting the semiconductor substrate with a dopant of a second dopant type, implanting the semiconductor substrate with a dopant of the first dopant type, unmasking the first area of the surface of the semiconductor substrate, implanting a second area in the first area with a dopant of the second dopant type, forming at least one source/drain pair of the second dopant type in the first area, wherein the source/drain pair is separated by the second area, and forming a gate on the substrate and over the second area.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

Figure 1:
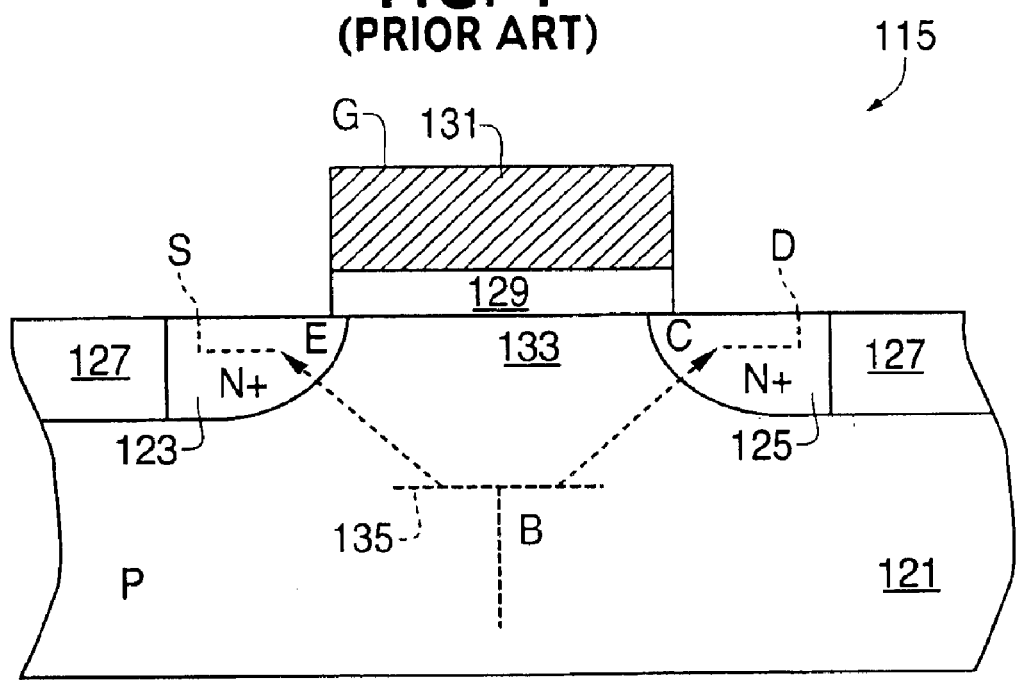
FIG. 1 is a cross-sectional view of a conventional low threshold voltage ESD protection device.
Figure 2:
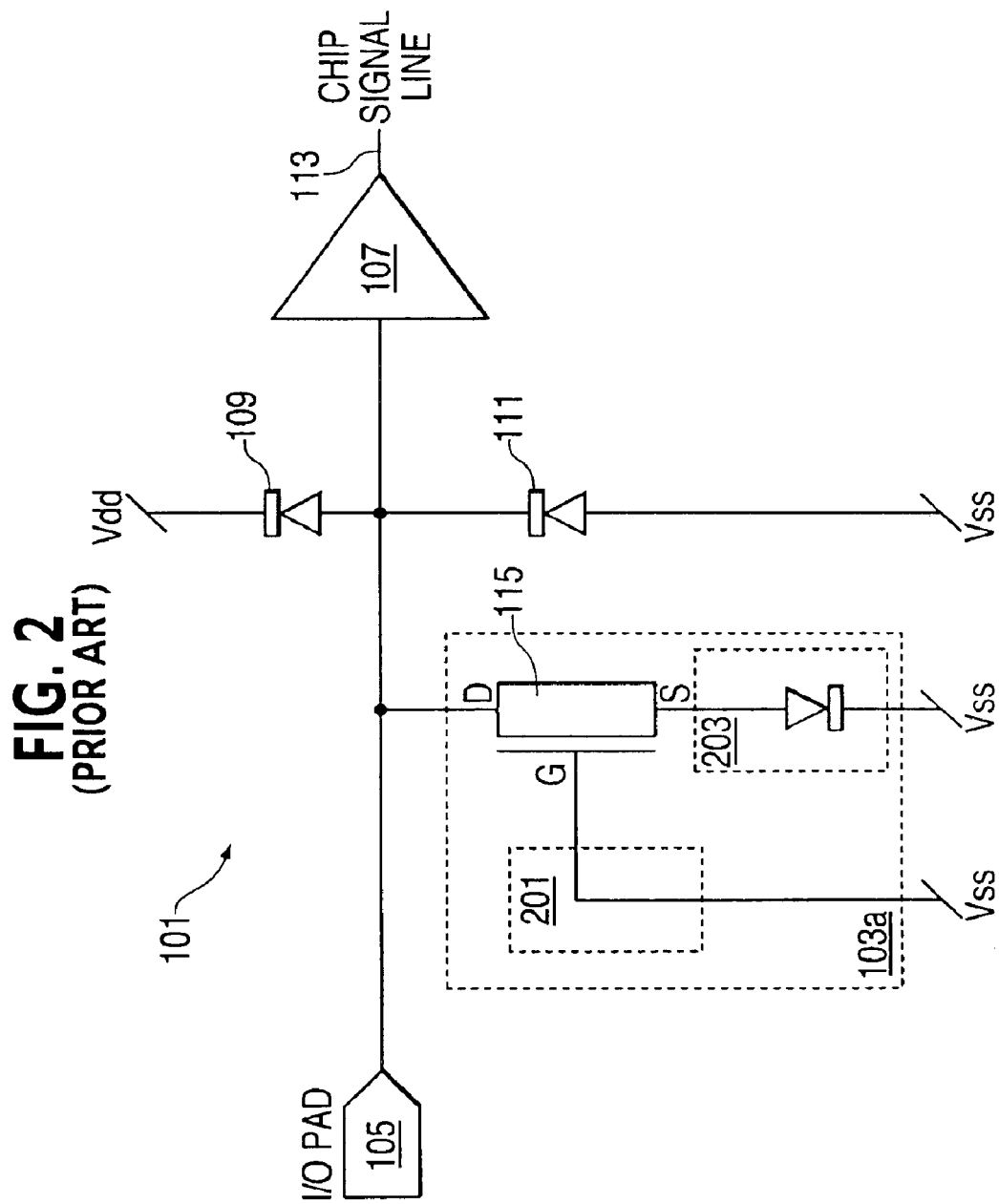
FIG. 2 is a schematic diagram of a conventional low threshold voltage ESD protection circuit.
Figure 3:
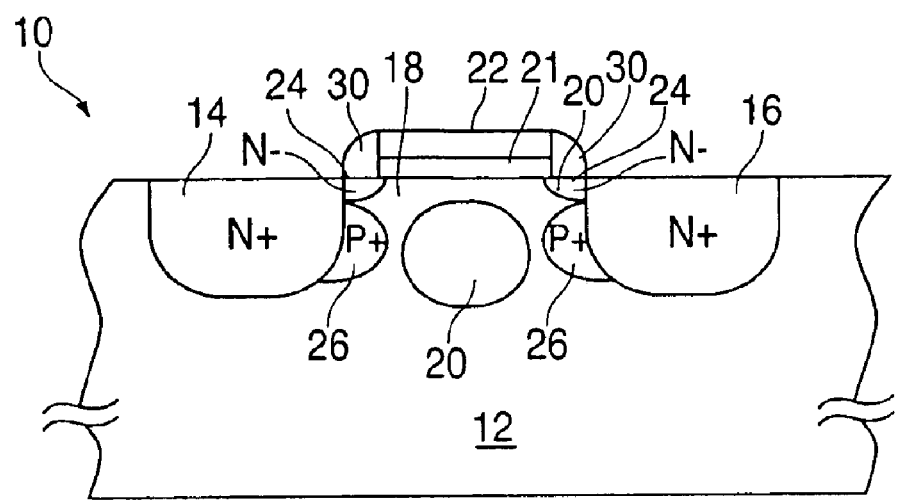
FIG. 3 is a cross-sectional view of an ESD protection device in accordance with one embodiment of the present invention.

FIG. 3 shows a cross-sectional view of an ESD protection device 10 in accordance with one embodiment of the present invention. Referring to FIG. 3, ESD protection device 10 includes a semiconductor substrate 12 of a first dopant type, at least one source/drain pair of a second dopant type formed in the substrate 12, in which the source/drain regions 14 and 16 of each source/drain pair are spaced apart to define a channel region 18 therebetween, and a lightly doped region 20 of the first dopant type formed between the source/drain pair and including at least a portion of the channel region 18. In one embodiment, the lightly doped region 20 may include a full channel region 18. The lightly doped region 20 has a dopant concentration lower than the substrate 12. Besides, one skilled in the art would understand that which of the regions 14 and 16 is labeled the source or drain is unimportant for purposes of the present invention.

The ESD protection device 10 also includes a gate dielectric layer 21 disposed over the substrate 12, and a gate 22 formed over the gate dielectric layer 21. The gate 22 of the ESD protection device 10 includes spacers 30 of silicon oxide, polyimide or the like. In one embodiment, the ESD protection device 10 includes lightly-doped drain (LDD) regions 24 to reduce hot electron effects. In one embodiment, the ESD protection device 10 includes pocket regions 26 to reduce the influence of short transistor gate length over transistor properties such as the threshold voltage.

The ESD protection device 10 shown in FIG. 3 is an NMOS device fabricated on a substrate 12 that is lightly doped with a first type of impurities, i.e., p-type impurities. However, one skilled in the art would understand that PMOS devices are fabricated in a similar manner by substituting the p-type impurities with n-type impurities. In addition, unlike conventional NMOS devices, the ESD protection device 10 is not formed in a p-well. In fabricating the device 10, a dummy layer (not shown) is used to mask the ESD protection device 10 from ion implants that would otherwise be necessary for conventional NMOS devices. Since the doped concentration of the channel region 18 is lower than that of the channel region of conventional NMOS devices, the threshold voltage of the ESD protection device 10 is reduced.

Figure 4:
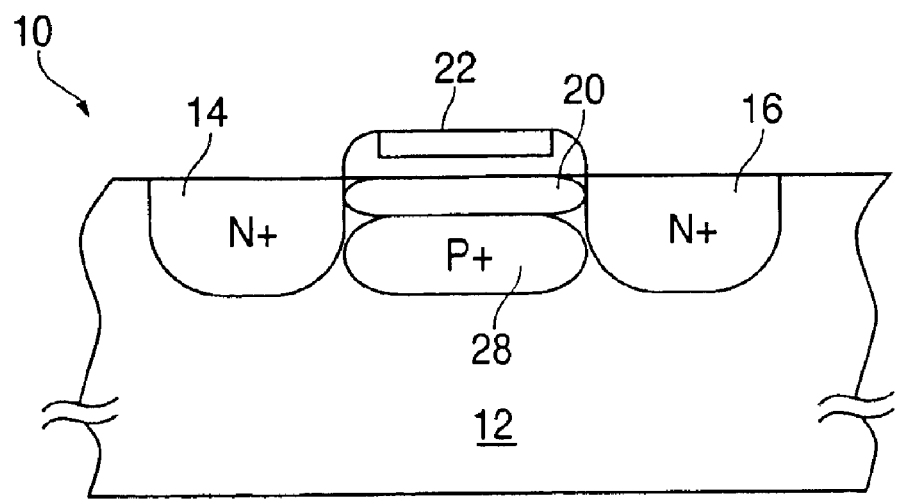
FIG. 4 is a cross-sectional view of an ESD protection device in accordance with one embodiment of the present invention.

FIG. 4 shows a cross-sectional view of the ESD protection device 10 consistent with another embodiment of the invention. Referring to FIG. 4, the ESD protection device 10 includes an anti-punchthrough region 28 of a p-type dopant to reduce leakage current. The anti-punchthrough region 28 is formed below the lightly doped region 20. In one embodiment, the anti-punchthrough region 28 is formed contiguous with one or all of the source and drain regions 14 and 16, and the lightly doped region 20.

Figure 5:
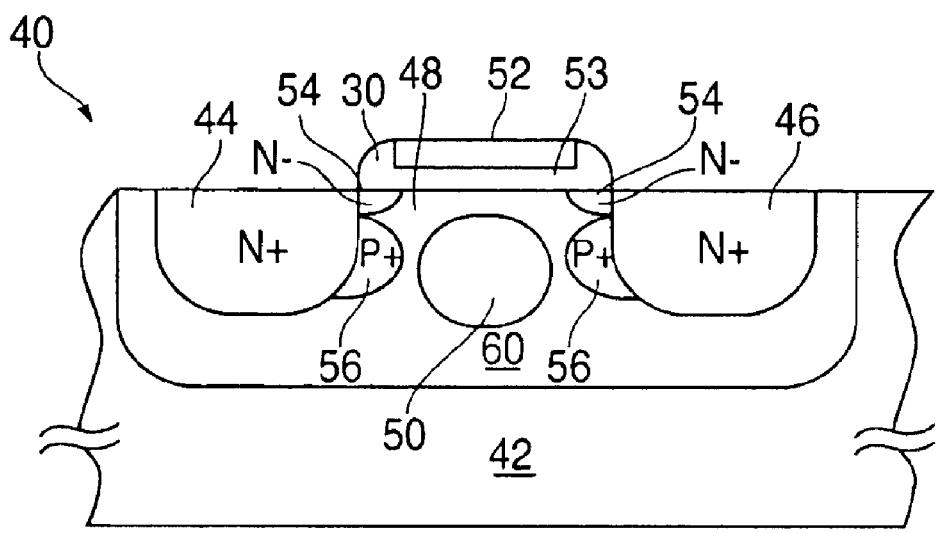
FIG. 5 is a cross-sectional view of an ESD protection device in accordance with another embodiment of the present invention.

FIG. 5 shows a cross-sectional view of an ESD protection device 40 consistent with another embodiment of the present invention. Referring to FIG. 5, the ESD protection device 40 includes a semiconductor substrate 42 of a first dopant type, a well region 60 of the first dopant type formed in the substrate 42, at least one source/drain pair of a second dopant type formed in the well region 60, wherein a source region 44 and a drain region 46 of a source/drain pair are spaced apart to define a channel region 48 therebetween, and a lightly doped region 50 of the first dopant type formed between the source and drain regions 44 and 46. In one embodiment, the lightly doped region 50 includes at least a portion of the channel region 48.

The ESD protection device 40 also includes a gate dielectric layer 53 formed over the substrate 42 and the channel region 48, and a gate 52 formed over the gate dielectric layer 53. The ESD protection device 40 is formed in a p-well 60, but has not undergone any channel or anti-punchthrough implants. In fabricating the ESD protection device 40, a dummy layer is used to mask the ESD protection device 40 from the channel and anti-punchthrough implants that would otherwise be necessary for conventional NMOS devices. As a result, the lightly doped region 50, which may include the channel region 48, is formed between the source and drain regions 44 and 46. Since the doped concentration of the channel region 48 is lower than that of the conventional NMOS devices, the threshold voltage of the ESD protection device 40 is reduced. Since the p-well region 60 has a higher doped concentration than the substrate 42, the ESD protection device 40 has a higher threshold voltage than the ESD protection device 10 shown in FIG. 3, but still has a lower threshold voltage than conventional devices.

Referring again to FIG. 5, in one embodiment, the ESD protection device 40 includes LDD regions 54 to reduce hot electron effects. In another embodiment, the ESD protection device 40 includes pocket regions 56 to reduce the influence of short transistor gate length on transistor properties such as the threshold voltage. In one embodiment, the source and drain regions 44 and 46 are doped with an n-type impurity, the LDD regions 54 are doped with an n-type impurity, and the pocket regions 56 are doped with a p-type impurity.

Figure 6:
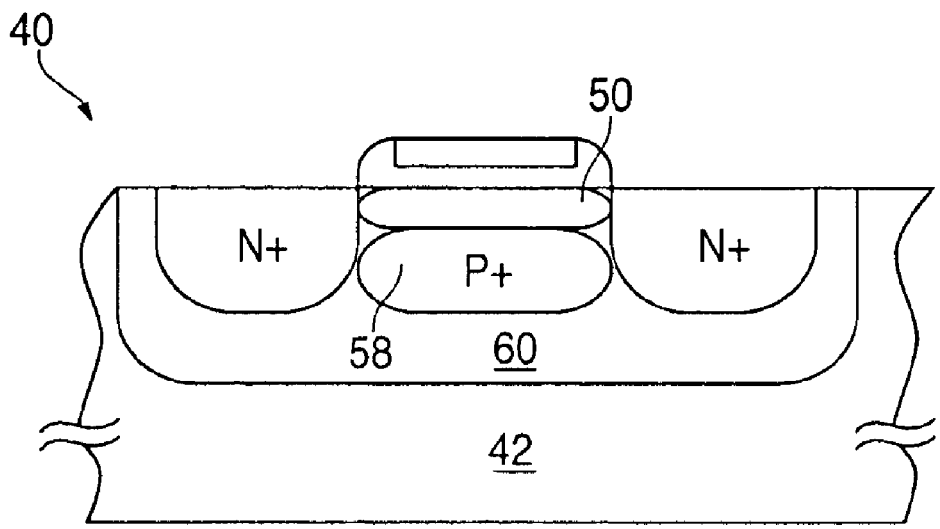
FIG. 6 is a cross-sectional view of an ESD protection device in accordance with one embodiment of the present invention.

FIG. 6 is a cross-sectional view of the ESD protection device 40 consistent with another embodiment of the invention. Referring to FIG. 6, the ESD protection device 40 includes an anti-punchthrough region 58 to reduce leakage current. In one embodiment, the anti-punchthrough region 58 is doped with a p-type impurity.

Figure 7:
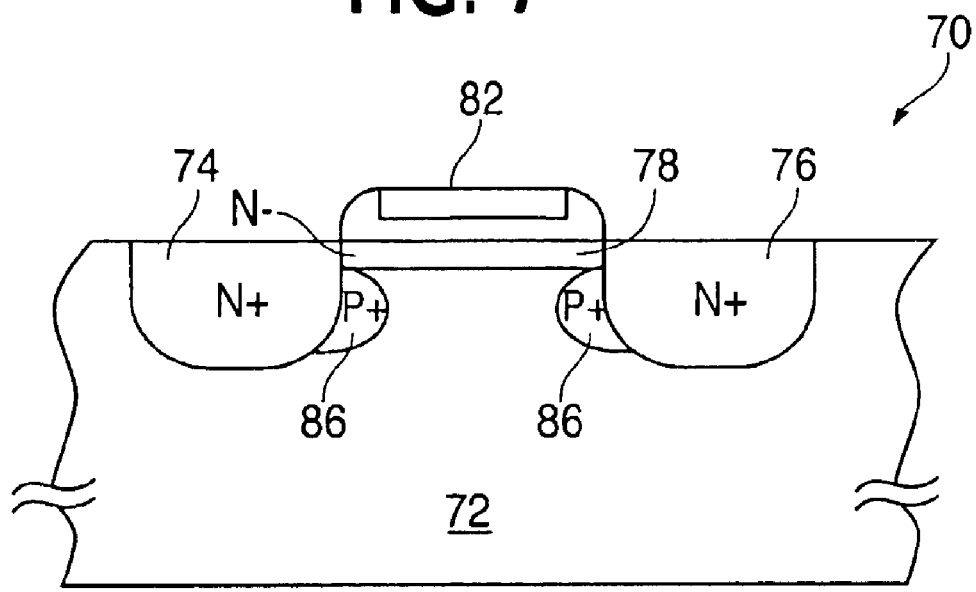
FIG. 7 is a cross-sectional view of an ESD protection device in accordance with still another embodiment of the present invention.

FIG. 7 is a cross-sectional view of an ESD protection device 70 consistent with still another embodiment of the present invention. Referring to FIG. 7, the ESD protection device 70 includes a semiconductor substrate 72 of a first dopant type, at least one source/drain pair of a second dopant type formed in the substrate 72, a lightly doped channel region 78 of the second dopant type extending between a source region 74 and a drain region 76 of a source/drain pair, and a gate 82 formed on the substrate 72 and over the channel region 78.

In fabricating the ESD protection device 70, a dummy layer is used to mask the ESD protection device 70 from a p-well, anti-punchthrough, and channel implants that would be otherwise necessary for general NMOS devices. In contrast to the heavily doped p-type channels of conventional NMOS devices, the channel region 78 of the ESD protection device 70 is lightly doped with an n-type impurity. The lightly doped n-type channel region 78 turns the threshold voltage of the NMOS ESD protection device 70 into a negative value so that the ESD protection device 70 is kept conductive during normal operation.

In one embodiment, the ESD protection device 70 includes pocket regions 86 to reduce the influence of short transistor gate length over transistor properties such as the threshold voltage. In one embodiment, the source and drain regions 74 and 76 are doped with an n-type impurity and the pocket regions 86 are doped with a p-type impurity.

Figure 8:
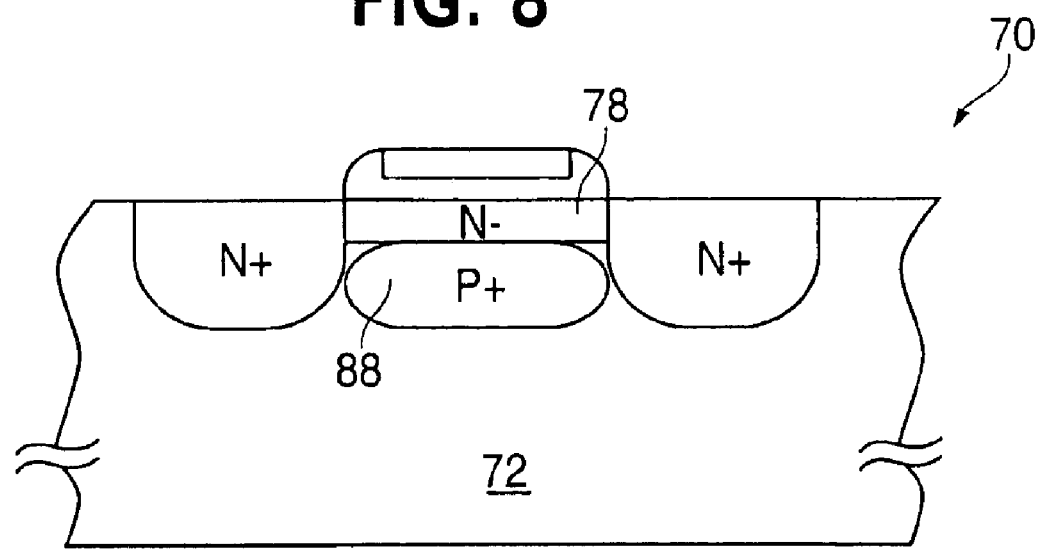
FIG. 8 is a cross-sectional view of an ESD protection device in accordance with one embodiment of the present invention.

FIG. 8 is a cross-sectional view of the ESD protection device 70 consistent with another embodiment of the invention. Referring to FIG. 8, the ESD protection device 70 includes an anti-punchthrough region 88 to reduce leakage current.

Figure 9:
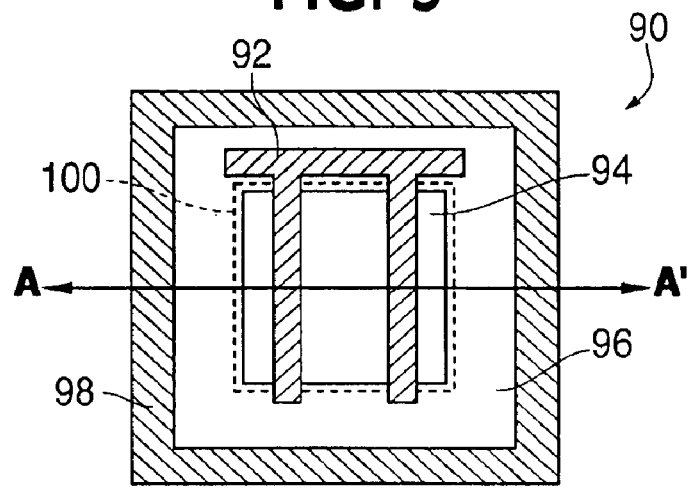
FIG. 9 is a layout of an ESD protection device in accordance with one embodiment of the present invention.

FIG. 9 shows a layout of a finger-type NMOS ESD protection device 90 in accordance with yet another embodiment of the present invention. The ESD protection device 90 includes a common gate region 92, a common source or drain region 94 of an n-type dopant, a dielectric region 96 such as a LOCOS or trench isolation, and a p-type dopant region 98. The finger-type device 90, similar to the ESD protection devices 10, 40 and 70 in FIG. 3, FIG. 5 and FIG. 7, respectively, has a lightly doped region formed under a dummy layer 100 (shown by dotted line) to reduce a threshold voltage.

Figure 10:
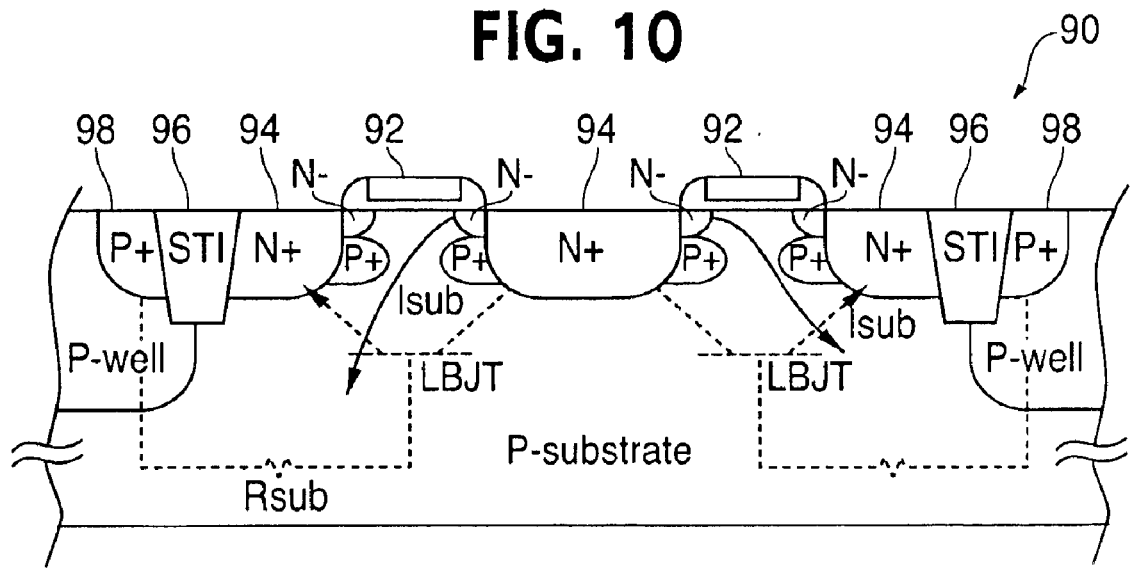
FIG. 10 is a cross-sectional view of the ESD protection device shown in FIG. 9.

FIG. 10 is a cross-sectional view of the ESD protection device 90 shown in FIG. 9 along the AA' direction. Referring to FIG. 10, the ESD protection device 90 includes at least one source/drain pair 94 and parasitic lateral bipolar junction transistor ("LBJTs") (not numbered). In operation, during an ESD event, the ESD protection device 90 achieves a drain-induced barrier lowering ("DIBL") effect, resulting in a larger substrate current $I_{sub}$ such that the LBJTs can quickly conduct an ESD current to ground.

Figure 11:
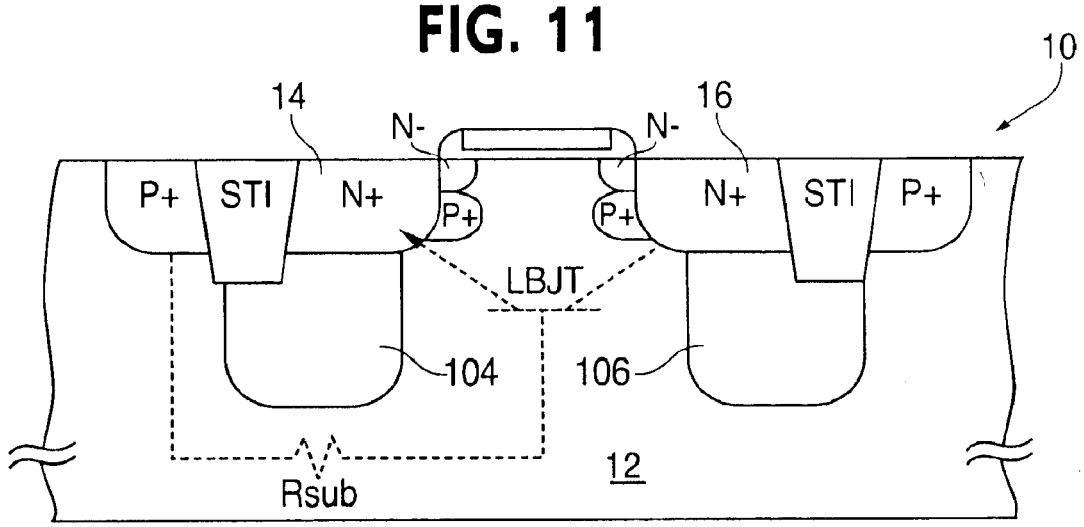
FIG. 11 is a cross-sectional view of an ESD protection device in accordance with one embodiment of the present invention.

FIG. 11 is a cross-sectional view of the ESD protection device 10 consistent with another embodiment of the invention. Referring to FIG. 11, the ESD protection device 10 includes a first diffused region 104 and a second diffused region 106, both of n-type dopant, formed under the source region 14 and the drain region 16, respectively. The first diffused region 104 has a larger implant depth than the source region 14, which increases the base, or substrate, resistance $R_{sub}$ of the ESD protection device 10. The second diffused region 106 has a larger implant depth than the drain region 16 and functions to direct an ESD current deep into the substrate 12 to increase heat dissipation of the ESD protection device 10. Therefore, the first diffused region 104 and the second diffused region 106 both contribute to the ESD robustness of the ESD protection device 10. One skilled in the art would understand that the first and second diffused regions 104 and 106 may be likewise incorporated into the ESD protection device 40 of FIG. 5, device 70 of FIG. 7, and device 90 of FIG. 9.

Figure 12:
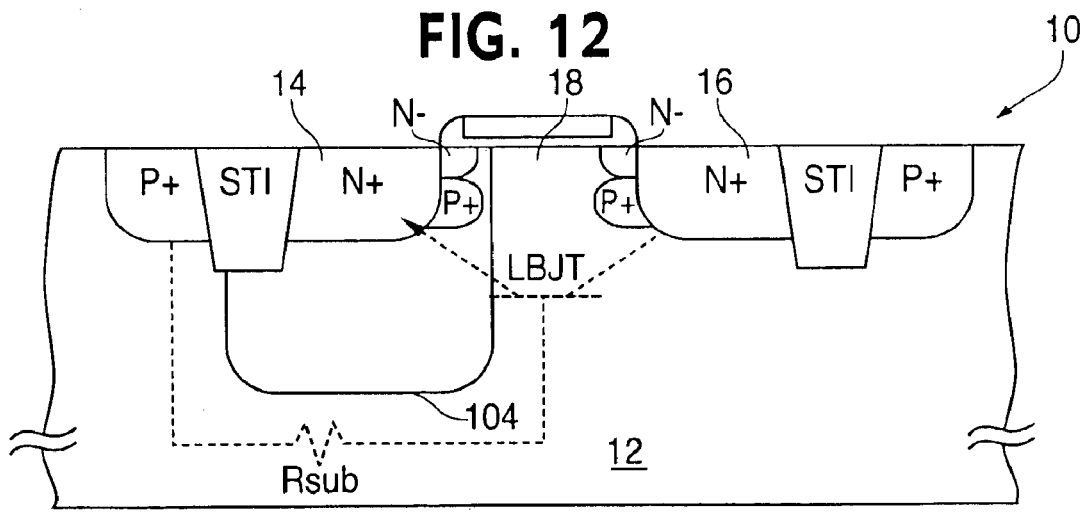
FIG. 12 is a cross-sectional view of an ESD protection device in accordance with one embodiment of the present invention.

FIG. 12 shows a cross-sectional view of the ESD protection device 10 consistent with still another embodiment of the invention. Referring to FIG. 12, the first diffused region 104 formed under the source region 14 extends into a portion of the channel region 18. The first diffused region 104 extending into the channel region 18 prevents the parasitic LBJT (shown by dotted line) from current crowding and increase the beta value, or the gain, of the parasitic LBJT. In one embodiment, the second diffused region 106 shown in FIG. 11 formed under the drain region 16 extends into a portion of the channel region 18. One skilled in the art would understand that the first diffused region 104 or the second diffused region 106 extending into the channel region 18 may be likewise incorporated into the ESD protection device 40 of FIG. 5, device 70 of FIG. 7, and device 90 of FIG. 9.

Figure 13:
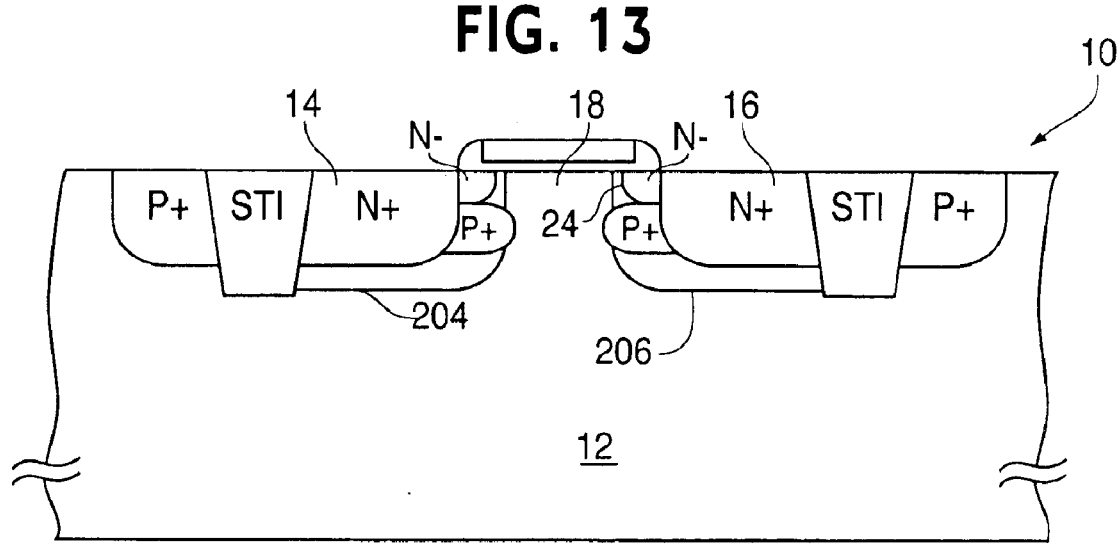
FIG. 13 is a cross-sectional view of an ESD protection device in accordance with one embodiment of the present invention.

FIG. 13 shows a cross-sectional view of the ESD device 10 consistent with yet another embodiment of the invention. Referring to FIG. 13, the ESD protection device 10 includes a third diffused region 204 and a fourth diffused region 206, both of which are doped with an n-type dopant, formed under the source region 14 and the drain region 16, respectively, and extending into a portion of the LDD regions 24. The third diffused region 204 or the fourth diffused region 206 has a smaller implant depth than the first diffused region 104 or the second diffused region 106. Both the third and fourth diffused regions 204 and 206 function to improve the ESD robustness of the ESD protection device 10. The third diffused region 204 or the fourth diffused region 206 may be likewise incorporated into the ESD protection device 40 of FIG. 5, device 70 of FIG. 7, and device 90 of FIG. 9.

Figure 14:
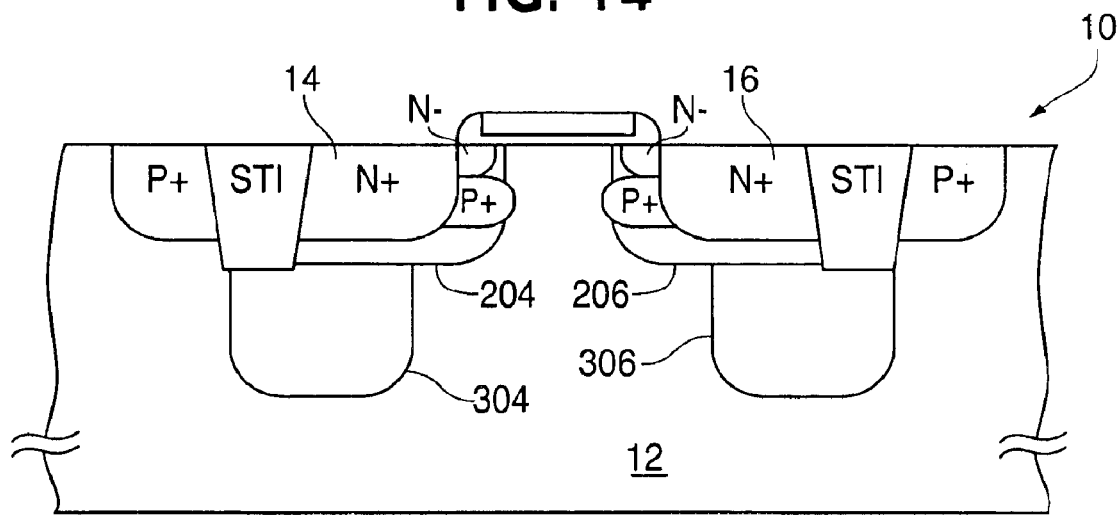
FIG. 14 is a cross-sectional view of an ESD protection device in accordance with one embodiment of the present invention.

FIG. 14 shows a cross-sectional view of the ESD protection device 10 consistent with yet another embodiment of the invention. Referring to FIG. 14, the ESD protection device 10 includes a fifth diffused region 304 and a sixth diffused region 306, both doped with an n-type dopant, formed under the third and fourth diffused regions 204 and 206, respectively. The fifth and sixth diffused regions 304 and 306 have the same functions as the first and second diffused regions 104 and 106 shown in FIG. 11, and are applicable to the ESD protection device 40 of FIG. 5, device 70 of FIG. 7, and device 90 of FIG. 9.

Figure 15:
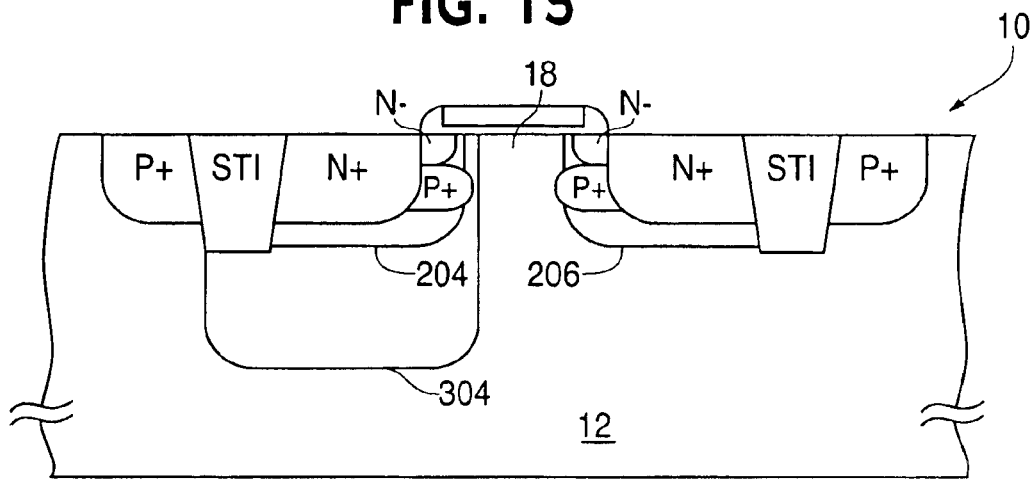
FIG. 15 is a cross-sectional view of an ESD protection device in accordance with one embodiment of the present invention.

FIG. 15 shows a cross-sectional view of the ESD protection device 10 consistent with yet another embodiment of the invention. Referring to FIG. 15, the fifth diffused region 304 formed under the third diffused region 204 extends into a portion of the channel region 18. The fifth diffused region 304 has the same functions as the first diffused region 104 shown in FIG. 12. In one embodiment, the sixth diffused region 306 shown in FIG. 14 extends into a portion of the channel region 18. The fifth diffused region 304 or the sixth diffused region 306 extending into the channel region 18 is applicable to the ESD protection device 40 of FIG. 5, device 70 of FIG. 7, and device 90 of FIG. 9.

Figure 16:
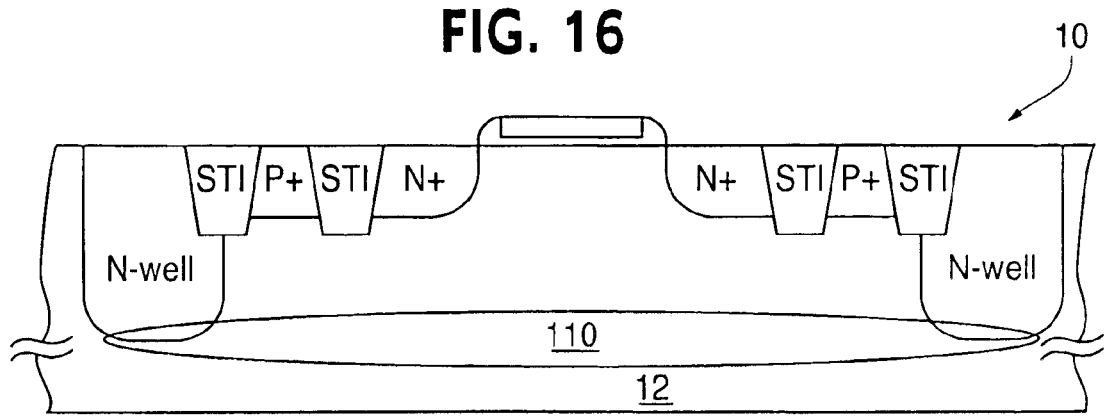
FIG. 16 is a cross-sectional view of an ESD protection device in accordance with one embodiment of the present invention.

FIG. 16 shows a cross-sectional view of the ESD protection device 10 consistent yet another embodiment of the invention. Referring to FIG. 16, the ESD protection device 10 includes a deep N-well region 110 to reduce leakage current. In one embodiment, the deep N-well region 110 has an implant depth of 2 to 5 μm (micron). The deep N-well 110 is formed after the semiconductor substrate 12 is prepared. One skilled in the art would understand that the deep N-well 110 is also applicable to the ESD protection device 40 of FIG. 5, device 70 of FIG. 7, and device 90 of FIG. 9.

Figure 17A:
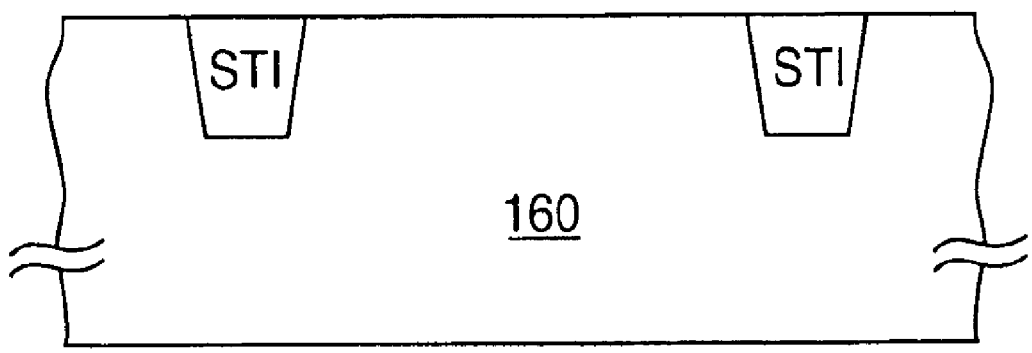
FIGS. 17A–17H show a method of manufacturing an ESD protection device in accordance with one embodiment of the present invention.
Figure 17B:
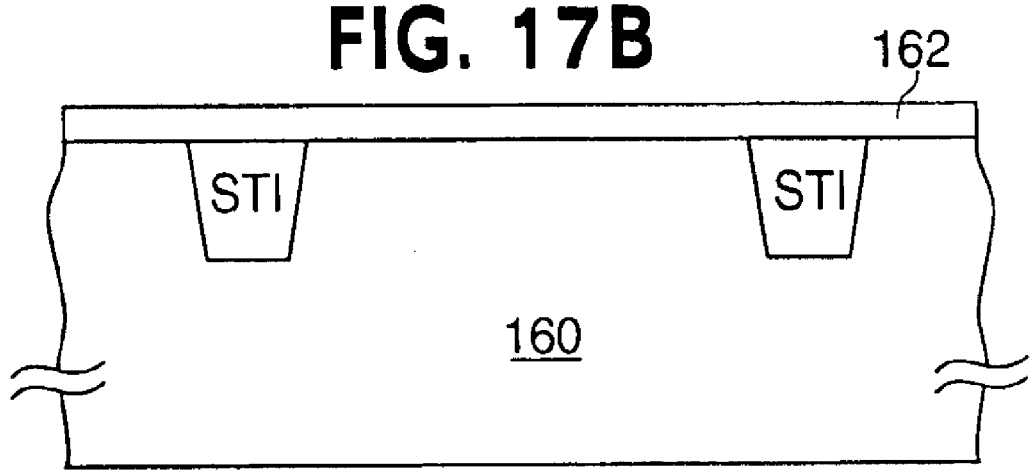

In addition, the present invention also provides methods for manufacturing ESD protection devices. In particular, FIGS. 17A–17H show the steps of a method in accordance with one embodiment of the present invention for manufacturing the ESD protection device 10. Referring to FIG. 17A, the manufacturing method of the present invention begins with the formation of STIs or LOCOS in a p-type substrate 160. In one embodiment, a deep N-well (not shown) is formed prior to the formation of the STIs and LOCOS. Referring to FIG. 17B, a photoresist layer 162 is provided over the substrate 160, and then patterned and defined. The patterned and defined photoresist layer 162 serves as a dummy, or sacrificial, layer to mask the portion of the substrate 160 covered by the photoresist 162 from subsequent implantation steps.

Figure 17C:
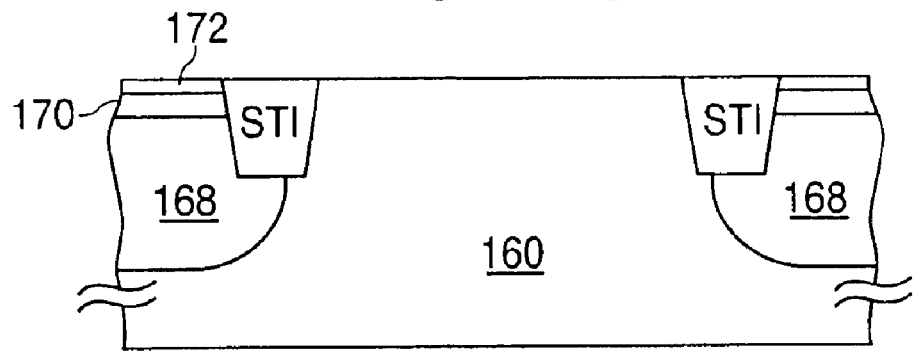

The steps of well implantation, anti-punchthrough implantation, and channel implantation are then performed. Referring to FIG. 17C, in areas not masked by the dummy layer, an n-well 168, an anti-punchthrough region 170, and a channel 172 are formed. The lightly doped p-type region 20 shown in FIG. 3 will be later defined to achieve the desired property of low threshold voltage. The photoresist 162 is then removed.

Figure 17D:
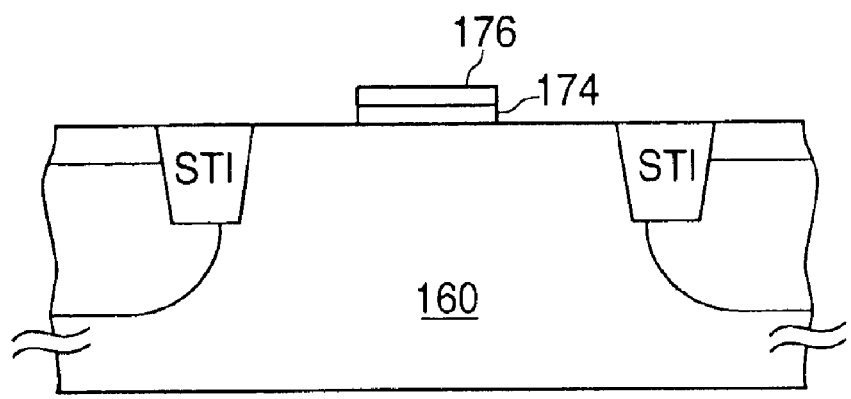

Conventional NMOS manufacturing steps may now follow. Referring to FIG. 17D, a gate oxide layer 174 is formed over the substrate 160 and a gate conductive layer 176, such as polysilicon, is deposited over the gate oxide layer 174. The gate oxide layer 174 and gate conductive layer 176 are patterned and etched.

Figure 17E:
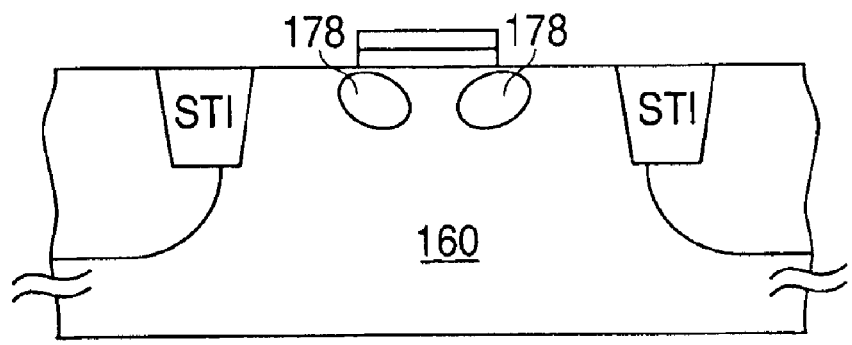
Figure 17F:
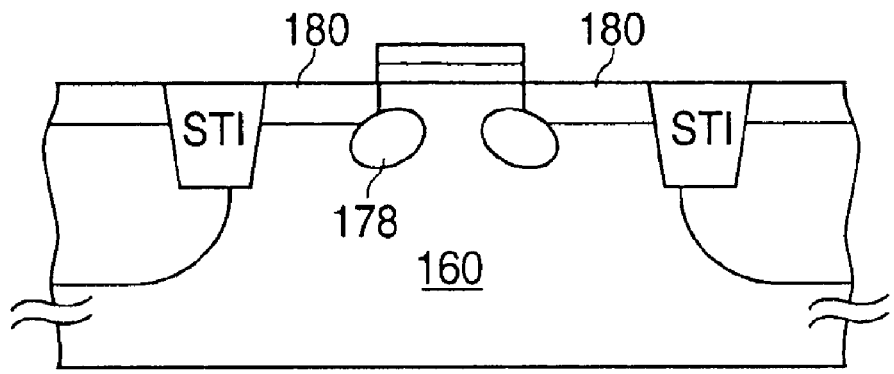
Figure 17G:
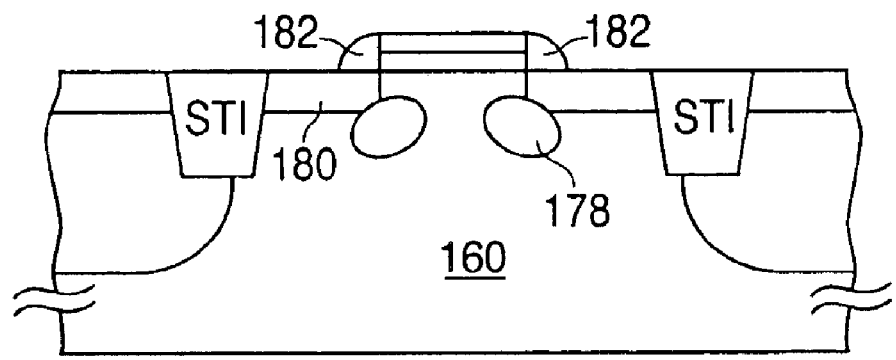
Figure 17H:
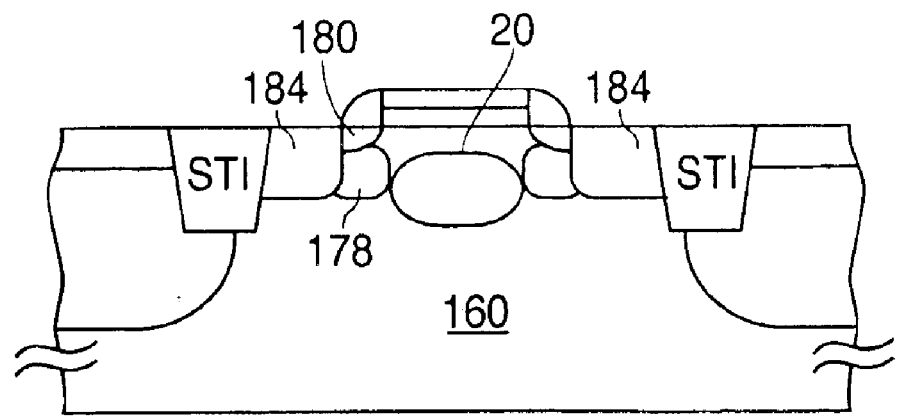

Referring to FIG. 17E, p-type pocket regions 178 may be optionally formed using an angled implant process. Referring to FIG. 17F, n-type LDD regions 180 are optionally formed. Referring to FIG. 17G, sidewall spacers 182 are formed contiguous with the patterned and etched gate oxide layer 174 and gate conductive layer 176. Referring to FIG. 17H, source and drain regions 184 are formed and the lightly doped p-type region 20 is defined between the source/drain pair 184. The manufacturing method of the present invention is therefore fully compatible with conventional CMOS processes.

Although not particularly described, the method of the present invention may optionally include forming the anti-punchthrough region 28 shown in FIG. 4, the first or second diffused region 104 or 106 shown in FIG. 11, the third or fourth diffused region 204 or 206 shown in FIG. 13, or the fifth or sixth diffused region 304 or 306 shown in FIG. 14 by conventional CMOS processes.

Figure 18A:
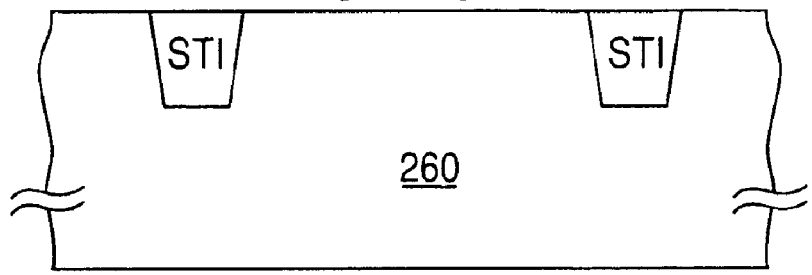
FIGS. 18A–18I show a method of manufacturing an ESD protection device in accordance with another embodiment of the present invention.
Figure 18B:
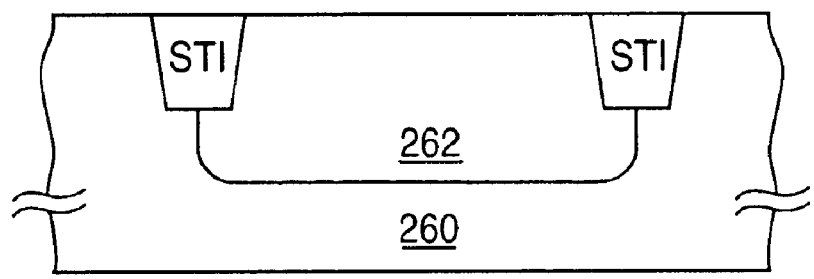

FIGS. 18A–18I show the steps of a method for manufacturing the ESD protection device 40. Referring to FIG. 18A, the manufacturing method of the invention begins by providing a p-type substrate 260 and forming STIs or LOCOS in the substrate 260. In one embodiment, after providing the substrate 260, a deep N-well (not shown) is formed in the substrate 260. Referring to FIG. 18B, a p-well region 262 is formed in the substrate 260 using conventional process.

Figure 18C:
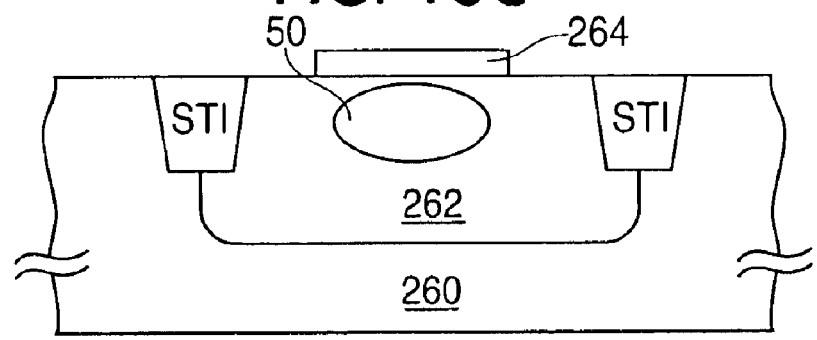

Referring to FIG. 18C, a photoresist layer 264 which serves as a dummy layer is deposited over the substrate 260. The photoresist layer 264 is then patterned and defined, and functions to mask the portion of the substrate 260 covered by the photoresist 264 from the subsequent implantation steps. Following the steps of anti-punchthrough implantation, and the channel implantation, the remaining steps shown in FIGS. 18D to 18I are similar to those of FIGS. 17C to 17H. The lightly doped p-type region 50 will be later defined to achieve the desired property of low threshold voltage.

Figure 18D:
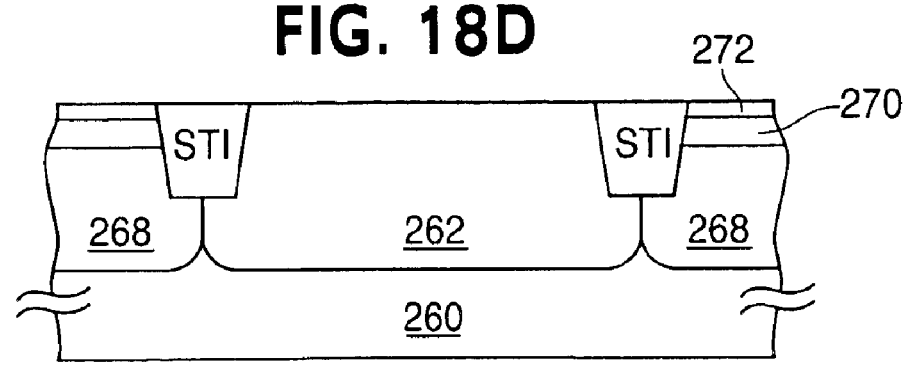
Figure 18E:
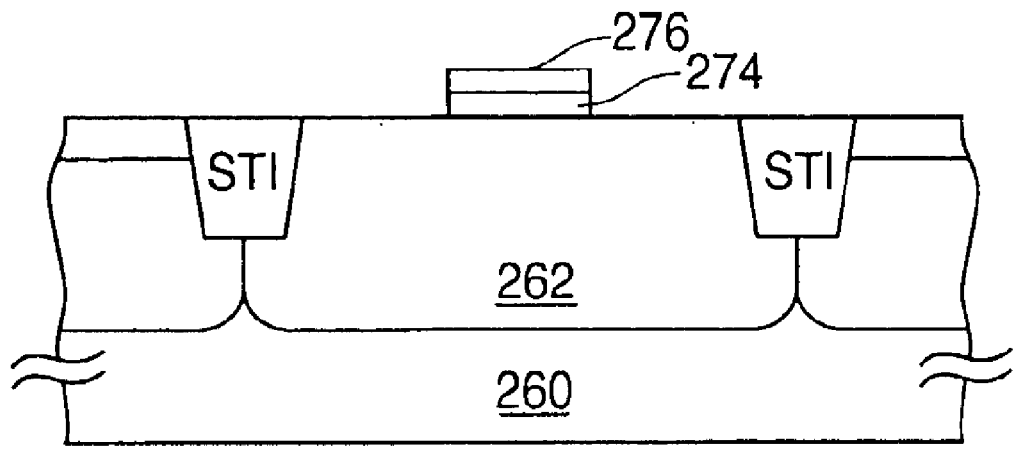

As shown in FIG. 18D, an n-well 268, anti-punchthrough region 270, and a channel 272 are formed in the substrate 260 through n-well implantation, anti-punchthrough implantation, and channel implantation steps. The patterned and defined photoresist layer 264 is removed. Referring to 18E, a gate oxide layer 274 is formed over the substrate 260 and a gate conductive layer 276 is formed over the gate oxide layer 274. The layers 274 and 276 are later patterned and etched.

Figure 18F:
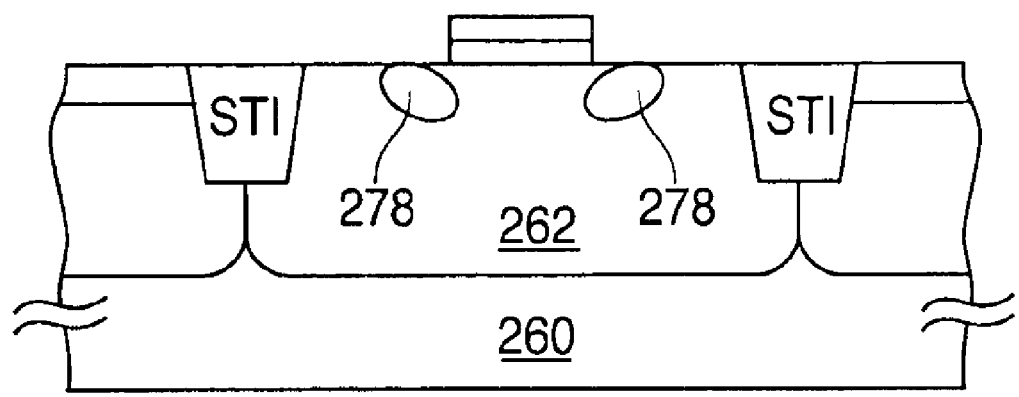
Figure 18G:
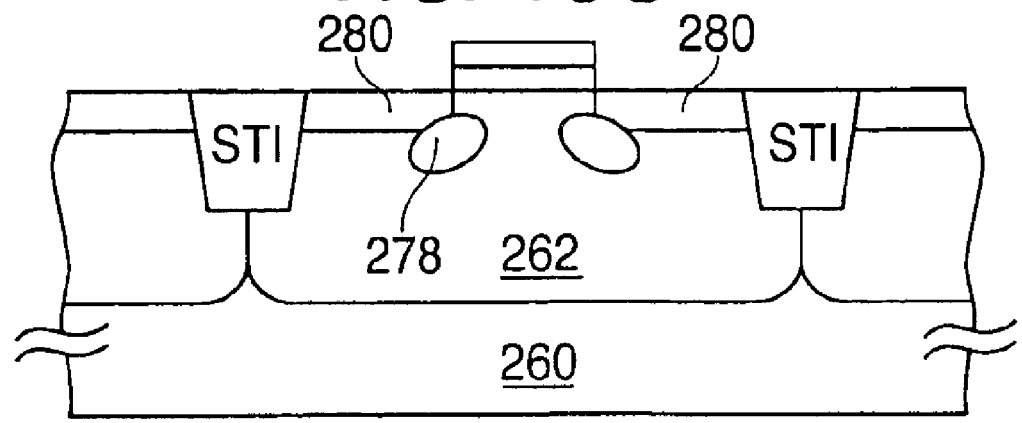
Figure 18H:
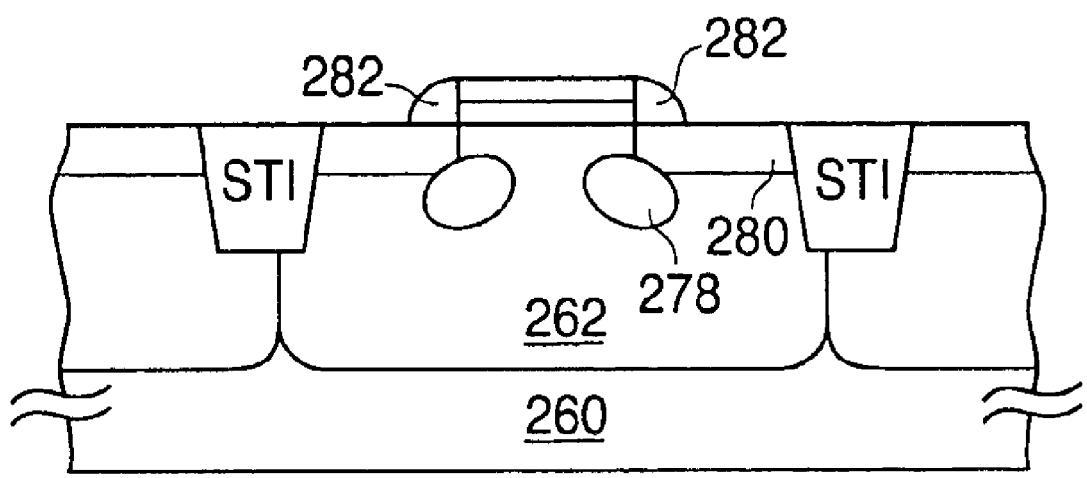
Figure 18I:
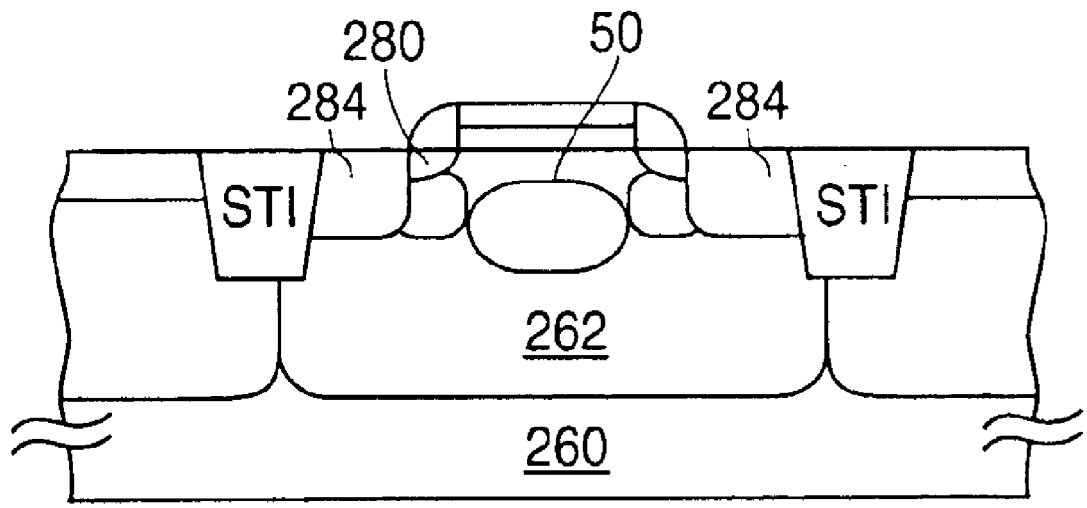

As shown in FIG. 18F, p-type pocket regions 278 may be optionally formed using angled implantation steps. Referring to FIG. 18G, n-type LDD regions 280 may also be optionally formed. In FIG. 18H, sidewall spacers 282 are formed contiguous with the etched gate oxide layer 274 and gate conductive layer 276. The source and drain regions 284 are then formed and the lightly-doped p-type region 50 is defined between the source/drain pair 284 as shown in FIG. 18I.

Figure 19A:
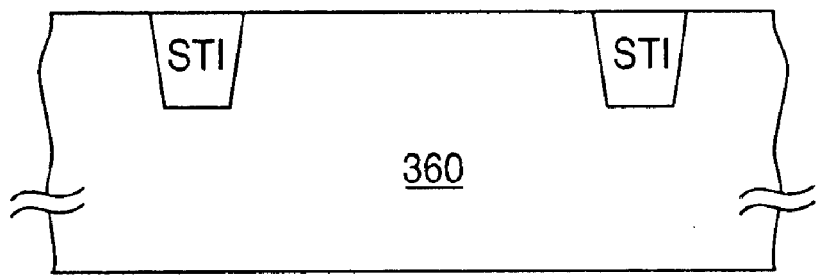
FIGS. 19A–19I show a method of manufacturing an ESD protection device in accordance with still another embodiment of the present invention.
Figure 19B:
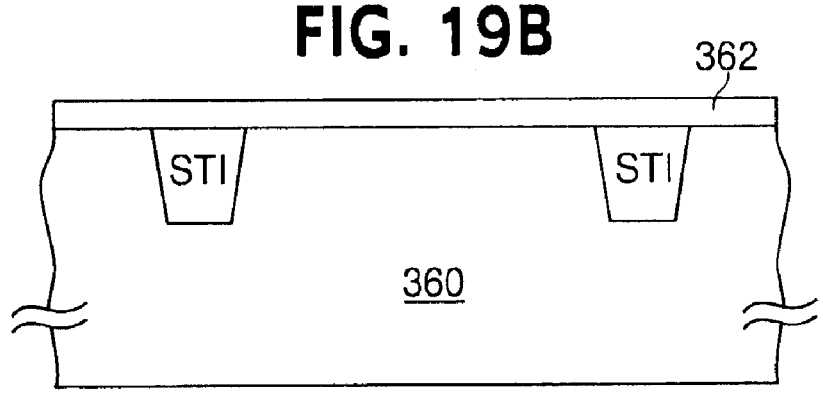

FIGS. 19A–19I show the steps of a method in accordance with one embodiment of the present invention for manufacturing the ESD protection device 70. Referring to FIG. 19A, the method of the invention begins with providing a p-type substrate 360 and forming STIs or a LOCOS in the substrate 360. In one embodiment, a deep N-well (not shown) is formed prior to the formation of the STIs or LOCOS. Referring to FIG. 19B, a first photoresist layer 362 is provided over the substrate 360, and then patterned and defined. The patterned and defined first photoresist layer 362 serves as a dummy layer to mask the portion of the substrate 360 covered by the photoresist 362 from subsequent implantation steps.

Figure 19C:
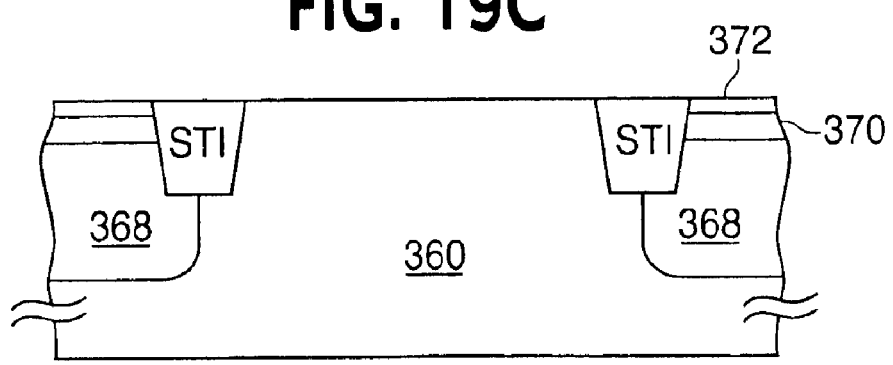

The steps of n-well implantation, anti-punchthrough implantation, and channel implantation are then performed. Referring to FIG. 19C, an n-well 368, an anti-punchthrough region 370, and a channel 372 are formed. The first photoresist layer 362 is then removed.

Figure 19D:
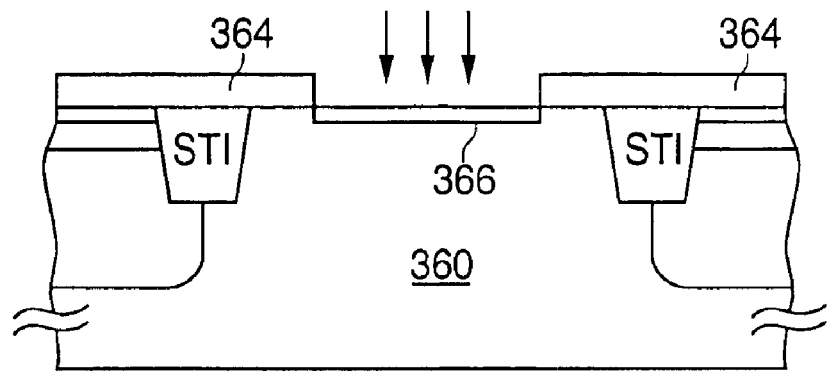
Figure 19E:
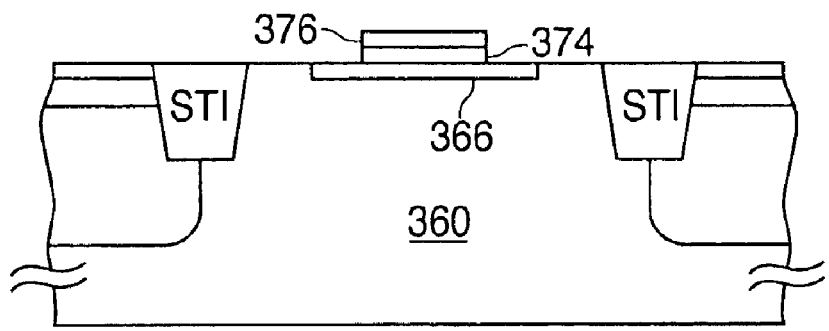
Figure 19F:
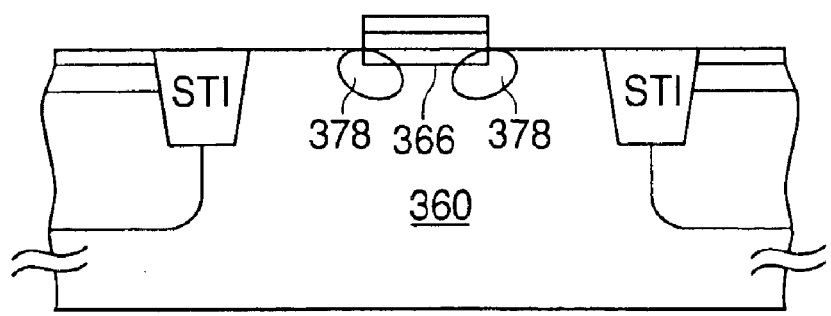
Figure 19G:
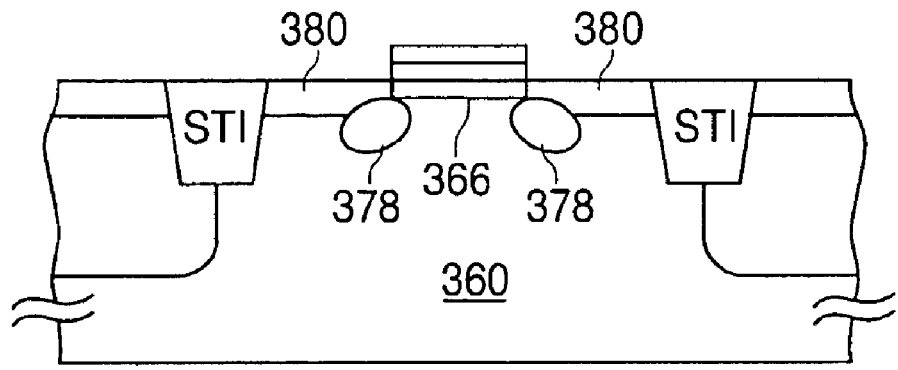
Figure 19H:
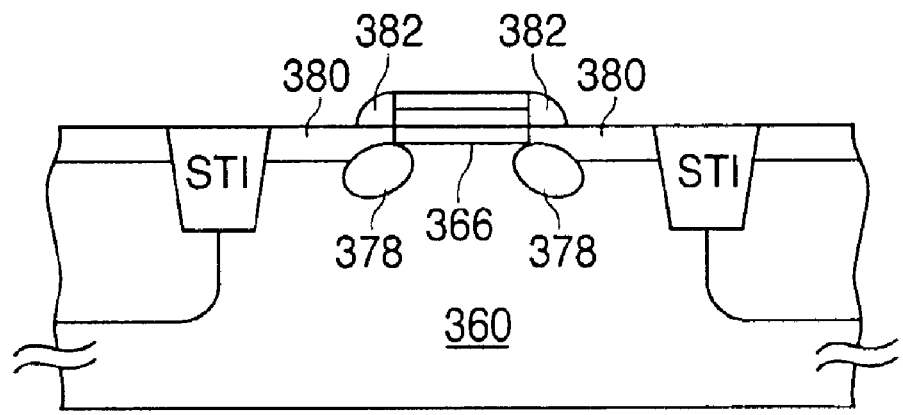
Figure 19I:
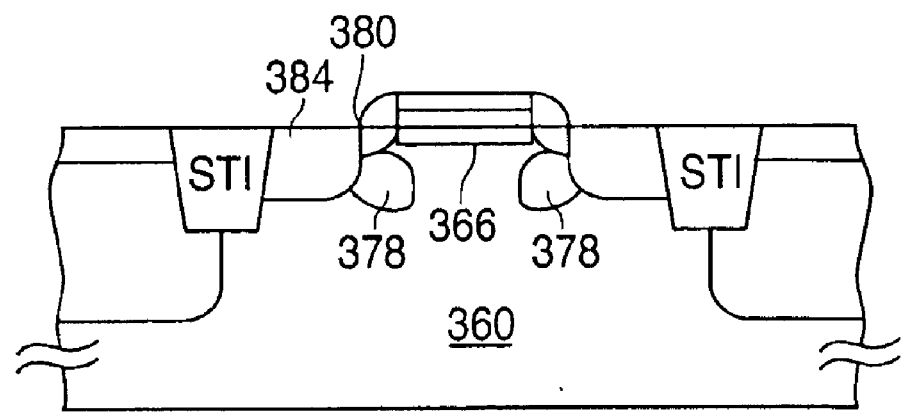

Referring to FIG. 19D, a second photoresist 364 is provided over the substrate 360, and is then patterned and defined. With the second photoresist 364 acting as a mask, an n-type impurity is implanted into the substrate 360 to form a lightly-doped n-type region 366. The lightly-doped n-type region 366, like the lightly-doped p-type region 20 of FIG. 3 or region 50 of FIG. 5, contributes to the desired property of low threshold voltage. Subsequent to the step of FIG. 19D, the remaining steps shown in FIGS. 19E to 19I are the same as the steps shown and described in FIGS. 17D to 17H.

Figure 20:
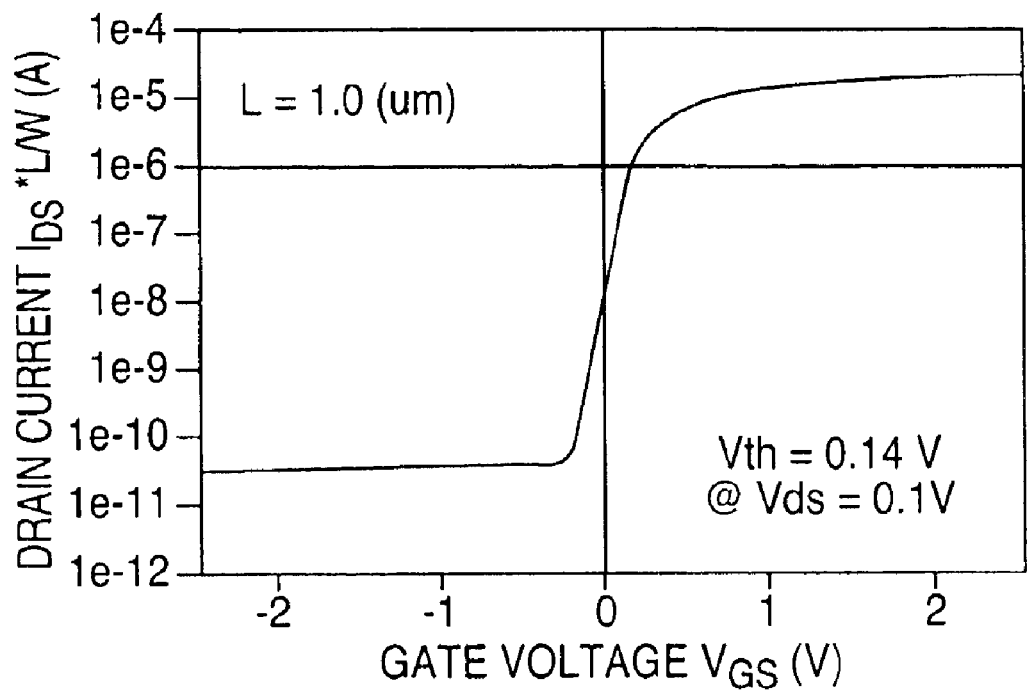
FIG. 20 is a plot showing the relationship between a drain current and a gate voltage of the ESD protection device shown in FIG. 3.

FIG. 20 is a plot showing the relationship between the drain current $I_{ds}$ and the gate voltage $V_{gs}$ of the ESD protection device 10 shown in FIG. 3. Referring to FIG. 20, when the gate voltage is at 0.14V, the drain current is at 1 uA. Accordingly, the threshold voltage of the device 10 of the present invention, 0.14V, is much lower than 0.6V, the threshold voltage of conventional MOSFETs.

Figure 21:
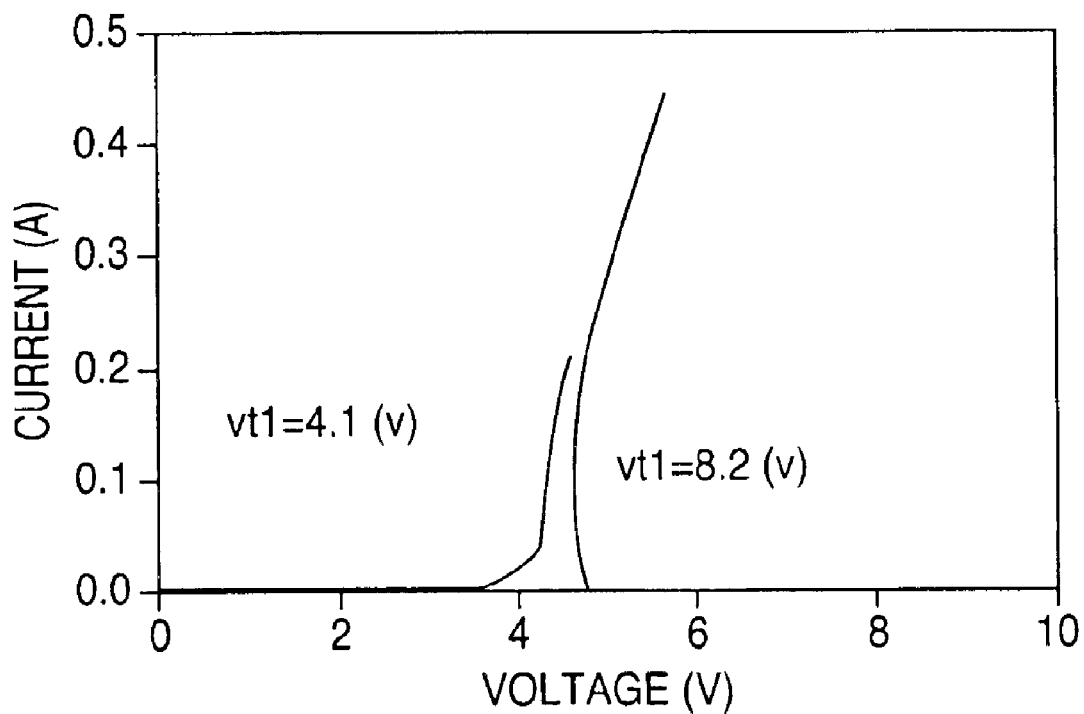
FIG. 21 is a current-voltage curve of the ESD protection device shown in FIG. 3.

FIG. 21 is current-voltage curve of the ESD protection device 10 shown in FIG. 3. As shown in FIG. 21, the breakdown voltage (Vt1) of the conventional MOSFETs is about 8.2V, while the breakdown voltage of the device 10 of the present invention is 4.2V. As a result, the ESD protection device 10 of the present invention turns on faster than conventional MOSFETs. The lower Vt1 value of the ESD protection device 10 is due to the DIBL effect, which results from a large substrate current to enable quicker conduction by the parasitic BJTs. In normal operations, a negative voltage source of about –0.4V may be applied to the gate of protection device 10 so as to prevent leakage current.

Figure 22:
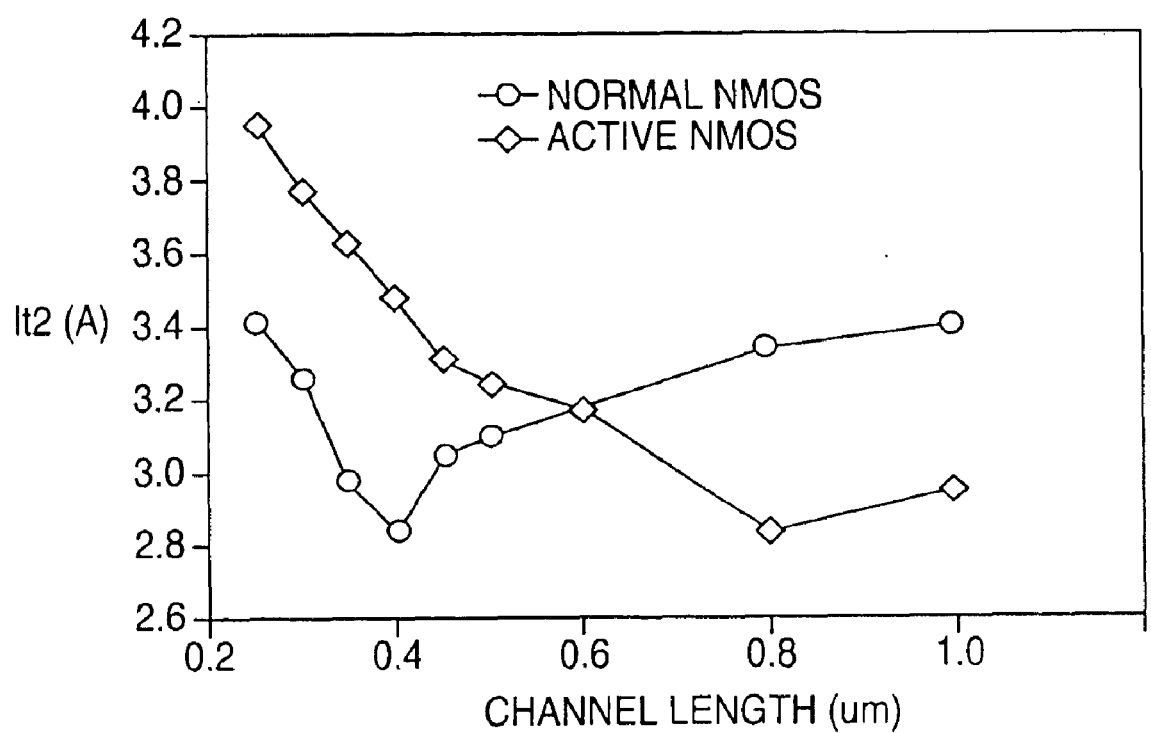
FIG. 22 is a plot showing a comparison in characteristics between the ESD protection device shown in FIG. 3 and a conventional ESD protection device.

FIG. 22 is a plot comparing the threshold current values of the ESD protection device 10 show in FIG. 3 and a conventional device. As shown in FIG. 22, when the channel length is less than 0.6 Φm, the ESD protection device 10 is more robust for ESD protection than conventional MOSFETs by an average of approximately 20%.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An electrostatic discharge protection device, comprising:
   a semiconductor substrate of a first dopant type;
   at least one source/drain pair of a second dopant type formed in the substrate, wherein the source/drain pair is separated to define a channel region therebetween;
   a lightly doped region of the first dopant type defined between the source/drain pair and including at least a portion of the channel region;
   a gate dielectric layer formed over the substrate;
   a gate formed over the gate dielectric layer and above the channels;
   a lightly doped region of the second dopant type formed adjacent one of the source/drain pair and under the gate; and
   a first diffused region formed under a drain region of the source/drain pair and extending into a portion of the lightly doped region of the second dopant type.

2. The device as claimed in claim 1, further comprising a pocket region of the first dopant type formed adjacent one of the source/drain pair and under the gate.

3. The device as claimed in claim 1, further comprising an anti-punchthrough region of the first dopant type formed under the channel region and extending between the source/drain pair.

4. The device as claimed in claim 1, further comprising a second diffused region of the second dopant type formed under a source region of the source/drain pair.

5. The device as claimed in claim 1, further comprising a third diffused region of the second dopant type formed under a drain region of the source/drain pair.

6. The device as claimed in claim 4, wherein the second diffused region is formed under the source region and extends into a portion of the channel region.

7. The device as claimed in claim 5, wherein the third diffused region is formed under the drain region and extends into a portion of the channel region.

8. The device as claimed in claim 1, further comprising a fourth diffused region formed under a source region of the source/drain pair and extending into a portion of the lightly doped region of the second dopant type.

9. The device as claimed in claim 8, further comprising a fifth diffused region of the second dopant type formed under the fourth diffused region.

10. The device as claimed in claim 1, further comprising a sixth diffused region of the second dopant type formed under the first diffused region.

11. The device as claimed in claim 9, wherein the fifth difused region extends into a portion of the channel region.

12. The device as claimed in claim 10, wherein the sixth diffused region covers the entire first diffused region.

13. The device as claimed in claim 1, further comprising a deep well region of the second dopant type formed in the substrate.

* * * * *